United States Patent
Gen-Ei et al.

(10) Patent No.: US 6,618,420 B1
(45) Date of Patent: Sep. 9, 2003

(54) MONOLITHIC MULTI-WAVELENGTH SEMICONDUCTOR LASER UNIT

(75) Inventors: Koichi Gen-Ei, Ichikawa (JP); Hideo Shiozawa, Yokohama (JP); Akira Tanaka, Yokohama (JP)

(73) Assignee: Kabushiki Kaisha Toshiba, Kanagawa-ken (JP)

( * ) Notice: Subject to any disclaimer, the term of this patent is extended or adjusted under 35 U.S.C. 154(b) by 0 days.

(21) Appl. No.: 09/639,018

(22) Filed: Aug. 15, 2000

(30) Foreign Application Priority Data

Aug. 18, 1999 (JP) .......................... 11-231042

(51) Int. Cl.[7] .............................. H01S 5/00
(52) U.S. Cl. ........................ 372/50; 372/45
(58) Field of Search .................... 372/45, 46, 50, 372/23, 49

(56) References Cited

U.S. PATENT DOCUMENTS

| | | | | |
|---|---|---|---|---|
| 4,092,659 A | * | 5/1978 | Ettenberg | 372/49 |
| 5,034,957 A |  | 7/1991 | Ohba | 372/45 |
| 5,663,974 A | * | 9/1997 | Tsujimura et al. | 372/45 |
| 5,805,630 A | * | 9/1998 | Valster et al. | 372/50 |
| 5,821,555 A | * | 10/1998 | Saito et al. | 372/45 |
| 5,953,357 A | * | 9/1999 | Hirata et al. | 372/46 |
| 6,058,124 A | * | 5/2000 | Sun et al. | 372/46 |

FOREIGN PATENT DOCUMENTS

| | | |
|---|---|---|
| JP | 1-204 487 | 8/1979 |
| JP | 8-4176 | 1/1996 |
| JP | 11-186651 | 7/1999 |

* cited by examiner

*Primary Examiner*—Quyen Leung
(74) *Attorney, Agent, or Firm*—Kilpatrick Stockton LLP

(57) ABSTRACT

This is a double wavelength semiconductor laser unit having a first laser emitting a light of a first wavelength and a second laser emitting a light of a second wavelength different from the first wavelength. The first and second lasers are merged on a substrate. The first laser has a bulk active layer whose film thickness is 0.01 $\mu$m or more and 0.1 $\mu$m or less. And the second laser has an MQW active layer constituted by stacked structure composed of a quantum well layer and a barrier layer. By employing the bulk active layer for the first laser, it is possible to reduce the band gap discontinuity induced at a boundary between a cladding layer and the bulk active layer, and then decreases an operational voltage, and further improve the reliability of the first laser.

17 Claims, 6 Drawing Sheets

FIG. 3A
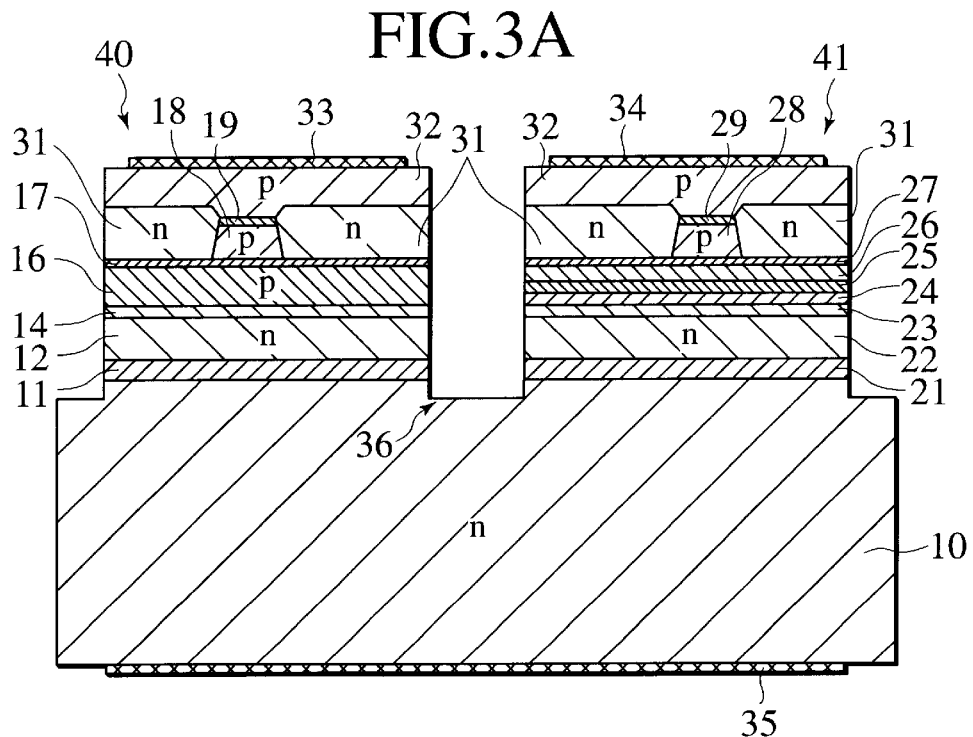
FIG. 3B
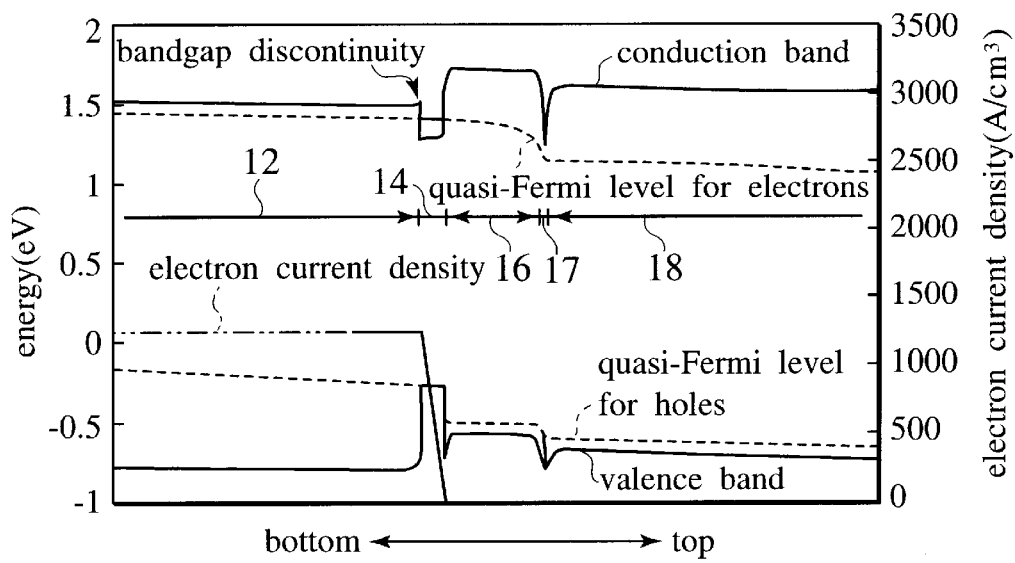
FIG. 3C
| | $I_{th}$(mA) | $I_{op}$(mA) | $V_{op}$(V) | $I_m$(mA) | $\theta_\perp$ (degree) | $\theta_\parallel$ (degree) | $\lambda p$(nm) |
|---|---|---|---|---|---|---|---|
| 650nm element | 42 | 50.8 | 2.22 | 0.16 | 7.7 | 25 | 657 |
| 780nm element | 38 | 51.3 | 2.13 | 0.17 | 9.2 | 31 | 789 |

MONOLITHIC MULTI-WAVELENGTH SEMICONDUCTOR LASER UNIT

CROSS REFERENCE TO RELATED APPLICATIONS

This application claims benefit of priority under 35 USC 119 based on Japanese Patent Application No. P11-231042 filed Aug. 18, 1999, the entire contents of which are incorporated by reference herein.

BACKGROUND OF THE INVENTION

1. Field of the Invention

The present invention pertains to optical communication, optical interconnects, and optical signal processing employing semiconductor lasers. More particularly, the present invention relates to a monolithic multi-wavelength semiconductor laser unit for outputting laser lights having different wavelengths from a single monolithically integrated semiconductor chip, which can be used in optical memory disk applications.

2. Description of the Related Art

An optical memory disk system is widely put to practical use since it is small-sized and it can record a large capacity of information. Especially, in a digital versatile disk (DVD) system, its practical use has been rapidly promoted as a main system such as a movie, a multi-media application for a next generation and the like. On the other hand, a compact disk (CD) system or a compact disk-recordable (CD-R) system has been conventionally widespread as an optical memory disk. It is desirable that the DVD system has compatibility with the CD system. That is, it is necessary that the DVD system can read and write data from and to a disk of CD or CD-R. Those optical memory disk systems employ an optical pickup using a semiconductor laser, in order to read out the information recorded on the disk, and/or write the information on the disk.

FIG. 1 is an explanation view showing a typical configuration proposed as an optical pickup of a conventional DVD system. That is, the optical pickup in FIG. 1 has compatibility with the disks of CD and DVD, and has an optical integration unit 1 for DVD and an optical integration unit 2 for CD and CD-R. A laser light having a wavelength of 650 nm emitted by the optical integration unit 1 for DVD passes through a dichroic prism 3, and also passes through a collective lens 4, a beam-rising mirror 5, a wavelength selection diaphragm 6 and an objective lens 7, and then reaches an optical memory disk 9. On the other hand, the prism 3 reflects a laser light having a wavelength of 780 nm, emitted from the optical integration unit 2 to the recording surface of CD. Then, it passes through an optical path substantially equal to that of the laser light emitting the radiation with the wavelength of 650 nm for DVD, and reaches a CD or CD-R disk 8. And, the return lights from the disk pass through optical paths opposite to the above-mentioned paths, and reach the optical integration units 1, 2 for DVD or CD, respectively.

However, the conventional optical pickup uses the two different optical integration units 1, 2 in order to obtain the laser light with the wavelength of 650 nm and that with the wavelength of 780 nm. Thus, its configuration becomes complex which results in a problem that it is difficult to make the optical pickup smaller and lighter. Also, the finely positional adjustments for respective light sources must be done to thereby require a very long time for assembling the optical system.

In order to solve such problems, a multi-wavelength semiconductor laser unit is proposed which can independently output laser lights having two different wavelengths of 650 nm and 780 nm from .one chip, as shown in FIG. 2A, which is proposed by Uchizaki et al. in Japanese Published Unexamined Patent Application No.P2000-11417A (hereinafter referred as "Uchizaki et al."). The semiconductor laser in FIG. 2A radiates the laser lights having the two different wavelengths. So, two active regions are arranged in parallel to each other in the optical axis directions. In FIG. 2A, the laser structure referred to as "a selectively buried ridge (SBR) structure" is shown. That is, p-type InGaAlP cladding layers 109, 119 are formed in ridge geometries. Then, both sides of the ridge are sandwiched by n-type GaAs layers 123 having column V elements Arsenic (As) different from the column V elements Phosphorus (P) in the cladding layers 109, 119. The n-type GaAs layers serves as current-blocking regions to thereby channeling current into active layers. At the same time, the GaAs layer in which band gap is narrower than that of the active layer absorbs a light transmitted through the active layers in the lower portions, at both the sides of the ridge 109, 119.

In detail, even in any of laser portions 100, 101, n-type buffer layers 102, 112, n-type InGaAlP cladding layers 103, 113, InGaAlP waveguide layers 104, 114, multi-quantum well (MQW) active layers 105, 115, InGaAlP waveguide layers 106, 116, first p-type InGaAlP cladding layers 107, 117, p-type InGaP etching stop layers 108, 118, second p-type InGaAlP cladding layers 109, 119, p-type InGaP conduction layers 110, 120, n-type current-blocking layers 123 and p-type GaAs contact layers 122 are laminated on substrates 124 in this order.

Here, in the first laser portion 100 emitting the radiation with the wavelength of 780 nm, the active layer 105 has the MQW structure composed of $Ga_{0.9}Al_{0.1}As$ quantum well layer and $Ga_{0.65}Al_{0.35}As$ barrier layer. In the second laser portion 101 emitting the radiation with the wavelength of 650 nm, the active layer 115 has the MQW structure composed of $In_{0.5}Ga_{0.5}As$ quantum well layer and $In_{0.5}(Ga_{0.5}Al_{0.5})_{0.5}P$ barrier layer.

That is, the active layer 105 emitting the radiation with the wavelength of 780 nm and the cladding layers 103, 107 and 109 have column V elements different from each other, namely, P and As. Also, the active layer 41 emitting the radiation with the wavelength of 650 nm and the cladding layers 22, 26 and 28 have column V elements P common to each other. This structure enables the compositions and the film thicknesses of the cladding layers 103, 107 and 109, and 113, 117 and 119 in the devices 100, 101, the compositions and the film thicknesses of the high conductivity films 110, 120, the compositions and the film thicknesses of the current-blocking layers 123 and the compositions and the film thicknesses of the contact layers 122 to have the commonalities to each other, and also enables the manufacturing processes to be very easy and further enables the control accuracies to be very high.

However, this also brings about a problem. FIG. 2B describes this problem. In FIG. 2B, the compositions, the carrier concentrations and the film thicknesses of the respective semiconductor layers are plotted, from the n-type cladding layer 103 to the p-type third cladding layer 109, along the lamination direction when a forward bias of 2.5 V is applied across the electrodes. The film thicknesses of the respective semiconductor layers are considered to accordingly simulate the energy band diagram, the Fermi-level diagram and the distribution of electron current densities. In the n-type cladding layer 103, the Al mole fraction is 0.7 as $In_{0.5}(Ga_{0.3}Al_{0.7})_{0.5}P$, the carrier concentration is $2 \times 10^{17} cm^{-3}$ and the layer thickness is about 1 μm. The compositions of the waveguide layer 104 and the buffer layer 102 are defined as undoped $In_{0.5}(Ga_{0.5}Al_{0.5})_{0.5}P$. The active layer 105 is a double quantum well (DQW) composed of two quantum well layers, namely, a first quantum well layer in contact with the n-type cladding layer 103 and a second quantum well layer adjacent to a right side of the first quantum well layer. Each of them is assumed to have the film thickness of 10 nm and the composition of undoped $Al_{0.1}Ga_{0.9}As$. There are the two p-type cladding layers 107, 109 sandwiching the etching stop layer 108 between them. However, they are designed such that all of the compositions are equal to that of the n-type cladding layer 103, the carrier concentrations are $1 \times 10^{17} cm^{-3}$ and the total thickness is equal to that of the n-type cladding layer. A longitudinal length of a resonator is defined as 600 μm.

In a conduction band edge in FIG. 2B, there is a large peak reaching 45% with respect to a depth of the first quantum well layer, at a boundary between the first quantum well layer of AlGaAs and the waveguide layer 104 of InGaAlP in contact with the n-type cladding layer 103. This is a phenomenon referred to "a band gap discontinuity", which is induced when semiconductors having the energy band gaps largely different from each other are in contact with each other. In the case of FIG. 2B, it results from a fact that the InGaAlP energy band gap (about 2 eV) is largely different from the AlGaAs band gap (about 1.6 eV). Also, because of the same reason, an energy level difference between respective bottom portions of the first and second quantum well layers is about 40% with respect to the depths of the first and second quantum well layers. So, the heights of the energy levels are extremely different. This difference brings about the situation referred to as a so-called "nonuniform injection", namely, the electron current injected into the active layer is not uniformly injected into the two quantum well layers. The band gap discontinuity and the nonuniform injection cause the injection efficiency of the electron to be very low. In the above-mentioned case, the electron current density in the active layer becomes 280 A/cm². It does not satisfy several hundred to several thousand kA/cm², which is a density necessary for a laser oscillation.

On the other hand, in the active layer 115 of the laser portion 41 emitting the radiation with the wavelength of 650 nm, the barrier layer of $In_{0.5}(Ga_{0.5}Al_{0.5})_{0.5}$ P is made of compound semiconductor having the same component as the InGaAlP waveguide layer 114. Thus, this does not bring about the problems of the band gap discontinuity and the nonuniform injection. The laser having the normal wavelength of 780 nm or 650 nm made of the compound semiconductor of the same component can obtain a laser output of about several mW if there is an applied voltage of about 2.5 V. So, it is possible to understand the low injection efficiency with the structure shown in FIG. 2A. The result, when a laser having a resonator length of 440 μm is actually fabricated under the above-mentioned structure, indicates that a voltage at which the laser oscillation is excited is equal to or greater than 2.7 V. Also, the voltage at which an optical power of 5 mW can be obtained is equal to or greater than 2.8 V. Those data agree with the tendency of the simulation result. If the laser is operating under such a high voltage, the power dissipation of a circuit for driving the laser is increased, which causes the rated specification, or the standard of the respective circuit elements to be strict, and accordingly makes the manufacturing cost higher, and further generates the heat-flow problem associated with the heat generation resulting from the increase of the power dissipation. This results in a severe problem on the circuit design.

SUMMARY OF THE INVENTION

The present invention is proposed to solve the above-mentioned problems. It is therefore an object of the present invention to provide a multi-wavelength semiconductor laser unit, which reduce a spike height at a band edge, or the band gap discontinuity induced at a boundary between a cladding layer and an active layer, and accordingly improves an operational voltage and an operational current.

Another object of the present invention is to uniform the electron currents injected into both active layers of first and second lasers by largely dropping the spike height caused by the band gap discontinuity at one of the laser in the multi-wavelength semiconductor laser unit.

Still another object of the present invention is to attain low power dissipation in a circuit for driving a laser by improving a carrier injection efficiency and dropping a voltage at which the laser oscillation is excited, in the multi-wavelength semiconductor laser unit.

Still another object of the present invention is to reduce a heat generation amount in a semiconductor chip by reducing a power dissipation, and then simplify a countermeasure for heat radiation, and accordingly make a design of a circuit for driving the multi-wavelength semiconductor laser unit and a package design easier.

Still another object of the present invention is to alleviate specifications of respective circuit elements used for driving circuit of the multi-wavelength semiconductor laser unit, and accordingly reduce manufacturing cost of the commercial products, such as a light source for an optical pickup in the multi-media instruments and the like.

In order to attain the above-mentioned objects, the feature of the present invention lies in a multi-wavelength semiconductor laser unit having a substrate, at least first and second lasers, which are merged on the substrate. The first laser has a bulk active layer, and the second laser has a MQW active layer. The term of "the bulk active layer" is employed to distinguish from the MQW structure. In the bulk active layer, electrons can be treated by classical theories, but quantum mechanical analysis is required for the MQW structure. Here, the first laser emits a light of a first wavelength, and the second laser emits another light of a second wavelength different from the first wavelength. Also, the bulk active layer has a film thickness which is 0.01 μm or more and 0.1 μm or less. On the other hand, the MQW active layer is constituted by the stacked structure, or the super-lattice structure. Namely, the MQW active layer has a plurality of potential well structure, each of the potential well structure has a quantum well layer and a barrier layer adjacent to the quantum well layer. The second laser disposed on the substrate is isolated from the first laser by an isolation groove and the like.

In both the first and second lasers, an active layer and a semiconductor layer adjacent to the active layer constitute a double hetero-structure, respectively. This double hetero-structure generates a potential well of a conduction band edge at the active layer, and also enables a structure by which a carrier confinement is effectively attained. As stated above, in the multi-wavelength semiconductor laser unit of the present invention, the active layer of the first laser is configured to have the bulk active layer. Thus, it is possible to largely reduce a spike height caused by the band gap discontinuity at the hetero-junction boundary between the active layer of the first laser and the semiconductor layer adjacent to the active layer. Also, it is possible to flatten the bottom of the potential well at the conduction band edge formed in the active layer of the first laser. The spike height which is inherently generated by the band gap discontinuity at the boundary between the active layer of the first laser and the semiconductor layer adjacent to the active layer is largely reduced, by employing the structure of the bulk active layer. Hence, there is no problem of the nonuniform injection, which was known in the MQW active layer. That is, since the band gap discontinuity and the nonuniform injection are protected or suppressed in the first laser, the injection efficiency of the electron becomes very high. This results in a reduction of a voltage at which a laser oscillation is excited, and also leads to the low power dissipation of a circuit for driving the first laser. Also, the heat generation amount is reduced by the reduction of the power dissipation. Hence, the simple countermeasure for the heat radiation may be allowable to thereby make the circuit design easier. Moreover, the alleviation of the required standard or the rated specification for respective circuit elements enables the manufacturing cost to become lower.

Moreover, in the multi-wavelength semiconductor laser unit of the present invention, the film thickness of the active layer of the first laser is assumed to be 0.1 μm or less. Thus, it is possible to protect a optical confinement coefficient Γ from being too large in the active layer of the first laser. Hence, it is possible to suppress the increase of an optical power density on the facet mirror. So, the deterioration on the facet mirror can be protected with regard to a operation for a long time. In short, this enables the achievement of excellent current injection efficiency and a high reliability.

As mentioned above, the multi-wavelength semiconductor laser unit of the present invention can output multiple-wavelength laser lights, each light having a single transverse mode, a small astigmatism, with lower operational voltages, lower operational currents, and an excellent productivity. Moreover, the multi-wavelength semiconductor laser unit of the present invention is suitable for the light source for driving the optical pickup that uses a wavelength different from that of CD-ROM, DVD-ROM or the like.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 3A is a sectional view, vertical to a ridge stripe direction, of a semiconductor laser unit of a first embodiment of the present invention;

FIG. 3B shows an electron current density distribution and a band diagram, simulated for the first laser of the first embodiment of the present invention;

FIG. 3C shows miscellaneous device performances in the semiconductor laser unit of the first embodiment of the present invention;

DETAILED DESCRIPTION OF THE PREFERRED INVENTION

Figure 1:
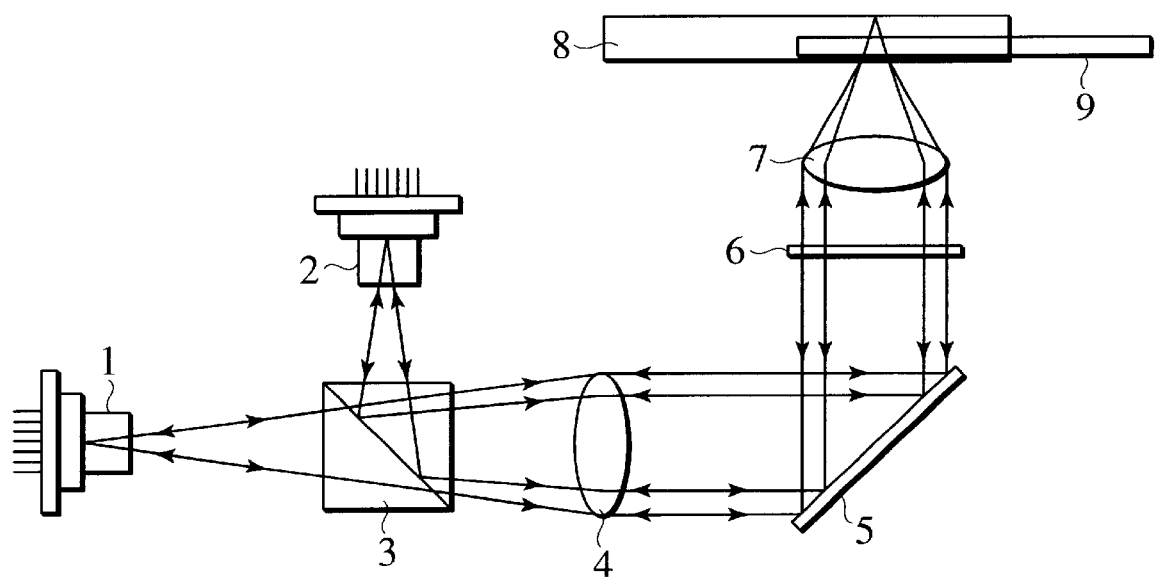
FIG. 1 shows a typical configuration of the optical system proposed as an optical pickup in a conventional DVD system.

Various embodiments of the present invention will be described with reference to the accompanying drawings. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings. In the following descriptions, numerous specific details are set fourth such as specific signal values, etc. to provide a though understanding of the present invention. However, it will be obvious to those skilled in the art that the present invention may be practiced without such specific details.

First Embodiment

FIG. 3A is a sectional view of a double wavelength semiconductor laser unit emitting radiations with wavelengths of 780 nm and 650 nm according to a first embodiment of the present invention. FIG. 3 shows the sectional view vertical to a ridge stripe direction formed in the double wavelength semiconductor laser unit. As shown in FIG. 3A, a first laser 40 emitting the radiation with the wavelength of 780 nm and a second laser 41 emitting that of 650 nm are merged on the same n-type GaAs crystal substrate 10. In the first laser 40, a second p-type cladding layer (first laser cladding layer of second conductivity type) 18 is delineated to have convex stripe referred to as "ridge", and both sides of the ridge 18 are sandwiched by GaAs current-blocking layers (first laser current-blocking layers) 31. Similarly, in the second lasers 41, second p-type cladding layer (second laser cladding layer of second conductivity type) 28 is delineated to have convex stripe, or the ridge, and both the sides of the ridge 28 are sandwiched by GaAs current-blocking layers (second laser current-blocking layers) 31. The first and second laser cladding layers of the second conductivity type are made of $In_y(Ga_{1-x}Al_x)_{1-y}P$ (0<x≦1, 0≦y≦1).

This structure channels a current into narrowly limited area of an active layers 14, 24 to then generate a striped gain distribution within the active layers 14, 24. Also, a part of lights penetrated into first p-type cladding layers 16, 26 among lights transmitted through the active layers 14, 24 at positions below both of the sides of the ridges 18, 28 are absorbed by GaAs layers 31 in which a band gap is narrower than that of the active layer 14, 24. For this reason, selectively optical losses are induced in the active layers 14, 24 at positions below both of the sides of the ridge, and a transverse mode becomes single mode to thereby lead to "a quasi-refractive-index-waveguide structure". The transverse single-mode and the current channeling can reduce an aspect ratio of a divergence angle $\theta_\perp$ perpendicular to the active layer to a divergence angle $\theta_\parallel$ parallel to the active layer, to a small value such as 4 or less. Also, a current at which an optical power of several mW can be obtained at a room temperature becomes small such as several ten mA. Moreover, the quasi-refractive-index-waveguide structure can reduce the astigmatism of the laser light to a small value such as about 10 $\mu$m. Thus, it is possible to fabricate the double wavelength semiconductor laser unit suitable for the light sources of the compatible optical pickup system for CD-ROM and DVD-ROM.

In detail, the first laser 40 emitting the radiation with the wavelength of 780 nm has the configuration that an n-type buffer layer 11, an n-type InGaAlP cladding layer (first laser cladding layer of first conductivity type) 12, the AlGaAs active layer 14, a first p-type InGaAlP cladding layer (a first laser cladding layer of second conductivity type) 16, a p-type InGaP etching stop layer 17, the second p-type InGaAlP cladding layer (another first laser cladding layer of second conductivity type) 18, a p-type InGaP conduction layer 19, the n-type current-blocking layers (first laser current-blocking layers) 31 and a p-type GaAs contact layer 32 are laminated on the n-type GaAs substrate 10 in this order.

The n-type cladding layer 12 is designed such that the composition is $In_{0.5}(Ga_{0.3}Al_{0.7})_{0.5}P$, the layer thickness is about 1 $\mu$m, silicon (Si) is used as dopant, and the carrier concentration is equal to or higher than $1\times10^{17} cm^{-3}$. Selenium (Se) may be also used as the dopant.

Also, the first p-type cladding layer 16 and the second p-type cladding layer 18 are designed such that they have the composition of $In_{0.5}(Ga_{0.3}Al_{0.7})_{0.5}P$, the total layer thickness is substantially equal to the thickness of the n-type cladding layer 12, the optical intensity profile along the upper and lower direction of the output laser light is symmetrical with respect to an axis, where the optical axis is parallel to the surface of the active layer. Zinc (Zn) is used as the dopant for the first p-type cladding layer 16 and the second p-type cladding layer 18. The carrier concentration is assumed to be equal to or higher than about $1\times10^{17} cm^{-3}$. Moreover, magnesium (Mg) or carbon (C) may be used as the dopant.

The active layer 14 made of $Al_zGa_{1-z}As$ ($0.1 \leq z \leq 1$) in the first laser 40 emitting the radiation with the wavelength of 780 nm is characterized in that it is the undoped layer of AlGaAs whose layer thickness is 0.01 $\mu$m or more and 0.1 $\mu$m or less. And the active layer 14 is referred as "the bulk active layer". As already explained, the term of "the bulk active layer" is employed to distinguish from the MQW structure. In the bulk active layer of the present invention, electrons can be treated by classical theories, but quantum mechanical analysis is required for the MQW structure as well known to expert in the art. In view of the state of art, the term "undoped layer" should be interpreted as "not intentionally doped layer" in the present invention, which will allow the semiconductor layer having an inherent carrier concentration less than about $1\times10^{16} cm^{-3}$.

The improvement of the current injection efficiency due to this structure will be described below with reference to FIGS. 3B and 3C. In FIG. 3B, the energy band diagram, the Fermi-level diagram and the distribution of the electron current densities are shown for the case that a forward bias of 2.5 V is applied across the electrodes of the first laser 40, plotting them from the n-type cladding layer 12 to the p-type second cladding layer 18 along the lamination direction. In the simulation shown in FIG. 3B, the compositions, the carrier concentrations and the film thicknesses of the first laser 40 according to first embodiment of the present invention, are considered.

The n-type cladding layer is designed such that the Al mole fraction is 0.7 as $In_{0.5}(Ga_{0.3}Al_{0.7})_{0.5}P$, the carrier concentration is $2\times10^{17} cm^{-3}$, and the layer thickness is about 1 $\mu$m. The active layer 14 is designed such that the thickness is 0.04 $\mu$m and it is the undoped layer having the composition of $Al_{0.15}Ga_{0.85}As$. There are the two p-type cladding layers 16, 18 sandwiching the etching stop layer 17 between them. Any of them is designed such that the composition is equal to that of the n-type cladding layer 12, the carrier concentration is $1\times10^{18} m^{-3}$, and the total layer thickness is equal to the thickness of the n-type cladding layer 12. A longitudinal length of a resonator is defined as 600 $\mu$m.

Figure 2A:
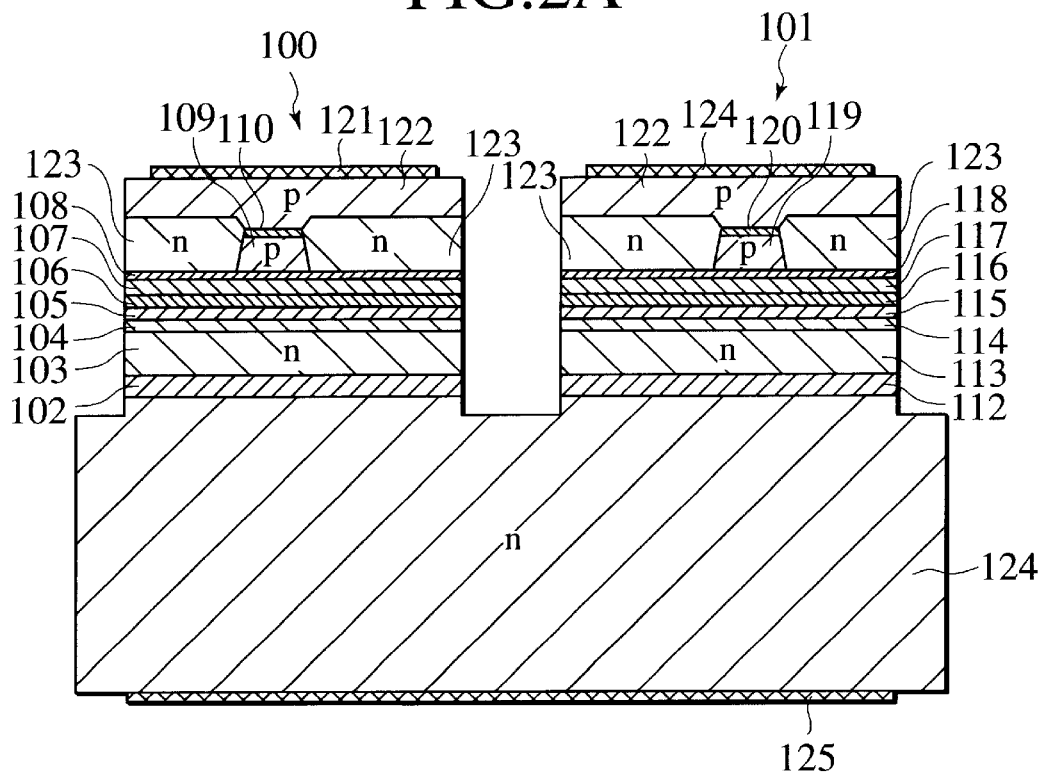
FIG. 2A is a sectional view, vertical to a ridge stripe direction, of a multi-wavelength semiconductor laser unit according to a related art.
Figure 2B:
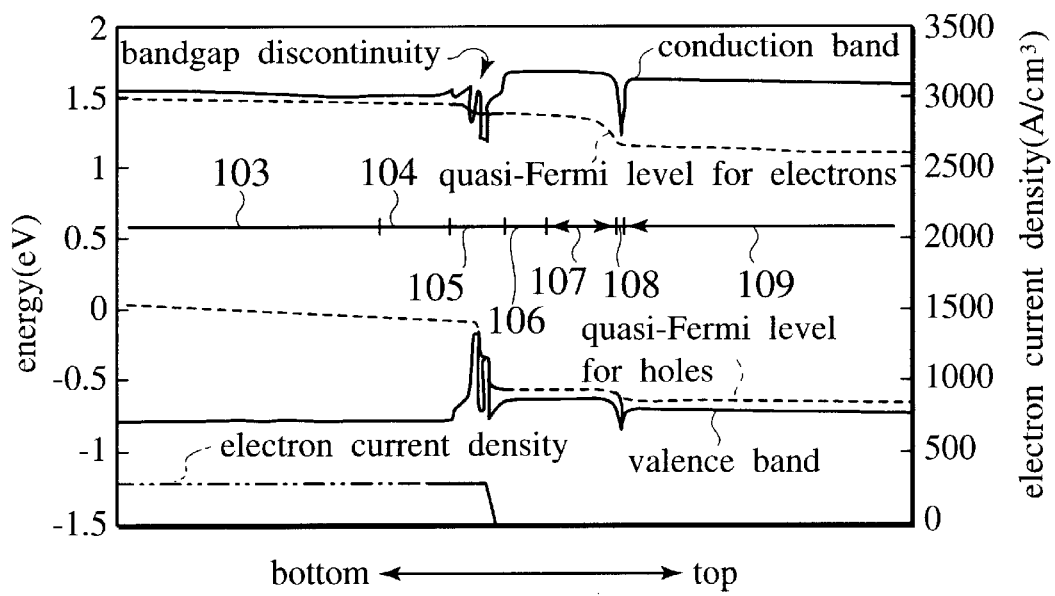
FIG. 2B shows an electron current density distribution and a band diagram, simulated for the multi-wavelength semiconductor laser unit shown in FIG. 2A.

A spike height of a band gap discontinuity induced at the boundary between the AlGaAs active layer 14 and the n-type cladding layer 12 shown in FIG. 3B is 25% with respect of a potential well energy depth formed at the bulk active layer 14. This is largely reduced as compared with the result that the spike height of the band gap discontinuity shown in FIG. 2B was 45% with respect to the quantum well energy depth. Also, a bottom of the potential well at the AlGaAs active layer 14 is extremely flat, which does not bring about the problem of the nonuniform injection shown in FIG. 2B. Those improvements enable the density of the electron current injected into the bulk active layer 14 to be 1.2 kA/cm$^2$, and it is increased up to 4.4 times that of FIG. 2B. This is a value under which the laser oscillation can be easily excited. The result of an actual fabrication of a device having a resonator length of 400 $\mu$m indicates that a bias voltage necessary for the oscillation is about 2.4 V and a voltage to obtain an optical power of 5 mW is about 2.5 V. Thus, the bias voltage is largely reduced, and the performance improvement can be confirmed by the structure of the first embodiment. If the thickness of the bulk active layer 14 is reduced to less than 0.01 $\mu$m (10 nm) at which the quantum well effect appears, the large band gap discontinuity is induced at the boundary of the first p-type cladding layer, similarly to the case of the related art shown in FIG. 2B, and the injection efficiency is reduced. On the contrary, if it becomes thicker than 0.1 $\mu$m, an optical confinement coefficient $\Gamma$ in the bulk active layer 14 is too large so that it exceeds an optical power density which can be allowed with regard to the reliability of facet. So, the deterioration on the facet is brought about with regard to the operation for a long time. Hence, it must be noted that the thickness of the bulk active layer 14 thicker than 0.1 $\mu$m causes a problem of the reliability. So, the excellent current injection efficiency can be achieved by setting the thickness of the bulk active layer 14 to be 0.01 $\mu$m or more and 0.1 $\mu$m or less. Moreover, it is possible to attain the double wavelength semiconductor laser unit having the high reliability.

The oscillation wavelength is also important when it is considered as the semiconductor laser for the optical memory disk. In the structure of the first embodiment, the Al mole fraction x of the bulk active layer 14 represented as $Al_xGa_{1-x}As$ needs to be 0.1 or more and 0.2 or less, in order to obtain the wavelength of 780 nm band as the light source for reading the CD-ROM. Moreover, if the thickness of the bulk active layer 14 at this time exceeds 0.05 $\mu$m, the aspect ratio ($\theta_\perp/\theta_\parallel$) is 4 or more. So, this is not suitable for the light source of the optical pickup for reading the CD-ROM. Thus, it is desirable that the thickness of the bulk active layer 14 is 0.5 μm or less. More preferably, the thickness of the bulk active layer 14 should be in the range between 0.1 μm and 0.05 μm. In short, if the aspect ratio is too high, a coupling efficiency with the optical system is reduced to thereby cancel out the margin for an optical power. In the laser in the first embodiment, the $\theta_\parallel$ is approximately 10 degrees or less. Hence, it is desirable that the $\theta_\perp$ is 40 degrees or less. The magnitude of the $\theta_\perp$ corresponds to the magnitude of the optical confinement coefficient Γ in the bulk active layer 14. In a region where the film thickness of the bulk active layer 14 is 1 μm or less, the film thickness of the bulk active layer 14 is thicker, the higher optical confinement coefficient Γ is obtained. Hence, it is desirable that the bulk active layer 14 has the thickness equal or less than a specific thickness to obtain a desired aspect ratio. It is especially desirable that the film thickness is 0.05 μm or less.

The structure of the second laser 41 will be described below. The second laser 41 emitting the radiation with the wavelength of 650 nm has the configuration that an n-type buffer layer 21, an n-type InGaAlP cladding layer (a second laser cladding layer of first conductivity type) 22, an InGaAlP waveguide layer 23, the MQW active layer 24, an InGaAlP waveguide layer 25, the first p-type InGaAlP cladding layer (a second laser cladding layer of second conductivity type) 26, a p-type InGaP etching stop layer 27, the second p-type InGaAlP cladding layer (another second laser cladding layer of second conductivity type) 28, a p-type InGaP conduction layer 29, the n-type current-blocking layers (second laser current-blocking layers) 31 and a p-type GaAs contact layer 32 are laminated on an n-type GaAs substrate 10 in this order.

The active layer 24 employs a separate confinement hetero-structure (SCH), in which the MQW active layer 24 is sandwiched by the undoped $In_{0.5}(Ga_{0.5}Al_{0.5})_{0.5}P$ waveguide layers 23, 25 formed above and below the MQW active layer 24. The MQW active layer 24 stacks periodically the paired structure consisting of an undoped quantum well layer having a composition of approximate $In_{0.5}Ga_{0.5}P$ and an undoped barrier layer having a composition of $In_{0.5}(Ga_{0.5}Al_{0.5})_{0.5}P$ so as to form a plurality of quantum wells. More generally, the undoped barrier layer can have a composition of $In_{0.5}(Ga_{1-q}Al_q)_{0.5}P$ (0<q<1). The undoped $In_{0.5}(Ga_{0.5}Al_{0.5})_{0.5}P$ waveguide layers 23, 25 have the same composition as the barrier layer. The MQW structure enables the generation of a two-dimensional electron gas and the laser operation in the 650 nm band. The SCH structure reduces a power density of a light transmitted through the active layer 24 and also protects the device from being broken by the deterioration on a facet. Moreover, the In mole fraction in the potential well layer is slightly reduced from 0.5 so that a lattice constant is increased for the GaAs substrate 10 and then a compression stress is applied to the potential well layer. Thus, a difference between an energy gap of the active layer 24 and an energy gap of the first p-type InGaAlP cladding layer 26 can be further increased. As a result, it is possible to reduce the so-called carrier overflow in which an electron current injected from the n-type InGaAlP cladding layer 22 passes through the active layer 24 and flows into the first p-type InGaAlP cladding layer 26. Moreover, the application of the compression stress to the active layer 24 enables the improvement of a differential gain of a laser, the reduction of an oscillation threshold current, the improvement of a slope efficiency, and the improvement of a reliability in an operation at a high temperature of 70° C. or more that is necessary for the semiconductor laser for the optical memory disk.

The first laser 40 emitting the radiation with the wavelength of 780 nm and the second laser 41 emitting that of 650 nm are designed such that they are electrically isolated from each other by an isolation groove 36 and they can be driven independently of each other by voltages applied between the p-side electrodes 33, 34 and the n-side electrode 35, respectively. The n-side electrode 35 can be commonly used from the substrate.

A wafer having the above-mentioned structure can basically be manufactured by using a known metalorganic chemical vapor deposition (MOCVD) technique, a known photolithography technique and a known etching technique, which are disclosed in Uchizaki et al., for example. Another known vapor phase epitaxy techniques, or the molecular beam epitaxy (MBE) technique may be used instead of the MOCVD technique. As for the formation of the isolation groove, a reactive ion etching (RIE) is used in Uchizaki et al. However, a typical wet chemical etching technique may be used if a width of the isolation groove is relatively wide, such as several ten μm or more.

The wafer in which the devices are formed is cleaved out as a bar-shaped semiconductor chip having a width corresponding to the required resonator length. Then, a collective coating is performed on the cleaved facet of the bar-shaped semiconductor chip. The coating method having excellent productivity can be attained since the depositions performed on the respective devices of 650 nm and 780 nm are not done in separate processes. It is desirable that the coating employs an electron cyclotron resonance (ECR) sputtering method, plentiful in mass productivity.

In the cleaved facet of the bar-shaped semiconductor chip, a reflection mirror is coated on a front facet side from which the laser light is emitted to external portion. The reflection mirror has an optical film thickness of λ/2 or integer times thereof with respect to a wavelength λ=715 nm. Here, the wavelength λ is substantially middle between the wavelengths of 650 nm and 780 nm. The reflection mirror is made of $Al_2O_3$ film, for example. Thus, a mirror reflectivity of the reflection mirror is about 30%. At this time, the reflection mirrors for both the second laser 41 emitting the radiation with the wavelength of 650 nm and the first laser 40 emitting that of 780 nm have a mirror reflectivity of 28% or more. Accordingly, the reflection mirrors serves as excellent passivation films, and also the threshold current and the slope efficiency become suitable values, which results in the excellent operation at a high temperature. Also, the device performances, such as the threshold current, the slope efficiency and the like, of the second laser 41 emitting the radiation with the wavelength of 650 nm and the first laser 40 emitting that of 780 nm are substantially coincident with each other, which enables the specification and the configurations of the respective drive circuits to be equal to each other when the optical pickup is manufactured, and can provide an excellent cost saving advantage.

In order that the second laser 41, emitting the radiation with the wavelength of 650 nm, can achieves the stable operation at the high temperature of 70° C. necessary for the optical memory disk system, another reflection mirror must be coated on a rear facet of the bar-shaped semiconductor chip. The reflection mirror on the rear facet requires a mirror reflectivity in this wavelength band of 60% or more. Also, the reflection mirror is designed such that the mirror reflectivity at the wavelength λ=715 nm, is 63% or more, in order to make the performance of the first laser 40 of 780 nm similar to that of the second laser 41 of 650 nm, similarly to the reflection film of the front facet. The structure of the reflection mirror can be attained as: a multiple-layer structure in which $Al_2O_3$ low refractive index film and Si high refractive index film are paired; or a multiple-layer structure in which $Al_2O_3$ low refractive index film in contact with an facet, $SiO_2$ low refractive index film repeatedly laminated thereon and SiN high refractive index film are paired; or a multiple-layer structure in which $TiO_2$ high refractive index film and $Al_2O_3$ low refractive index film are paired. Also, in such a way that the optical film thicknesses of the respective reflection mirrors are $\lambda/4$ or odd-numbered times thereof with respect to the wavelength $\lambda=715$ nm. The film thickness of the reflection mirror is selected so that it includes at least one layer or more of the optical film thickness. Accordingly, it is possible to carry out the reflection mirror deposition, having the excellent reproducibility, on the cleaved facets of the bar-shaped semiconductor chip. Due to those reflection mirrors, it is possible to manufacture the double wavelength semiconductor laser unit with the excellent reproducibility, which can obtain the optical powers of 5 mW or more in the respective wavelengths of 650 nm and 780 nm at a case temperature of 70° C. or more.

FIG. 3C shows the device performance of the double wavelength semiconductor laser unit manufactured under the above-mentioned structure and technique with the resonator length as 600 $\mu$m. The device performance suitable for the optical memory disk can be obtained such as a threshold current $I_{th}$, an operational current $I_{op}$ at a time of a 5 mW output, an operational voltage $V_{op}$, a monitor current $I_m$, a divergence angle $\theta_\perp$ in a direction vertical to the active layer, a divergence angle $\theta_\parallel$ in a direction parallel (horizontal) to the active layer, a wavelength $\lambda p$ and the like. Also, an reliability test at a high temperature for a long time is performed on those devices, under the conditions that the case temperature is 70° C. and the optical power is 5 mW. It can be verified that an estimated life is several thousands of times or more and there is no problem with regard to the reliability.

Second Embodiment

Figure 4A:
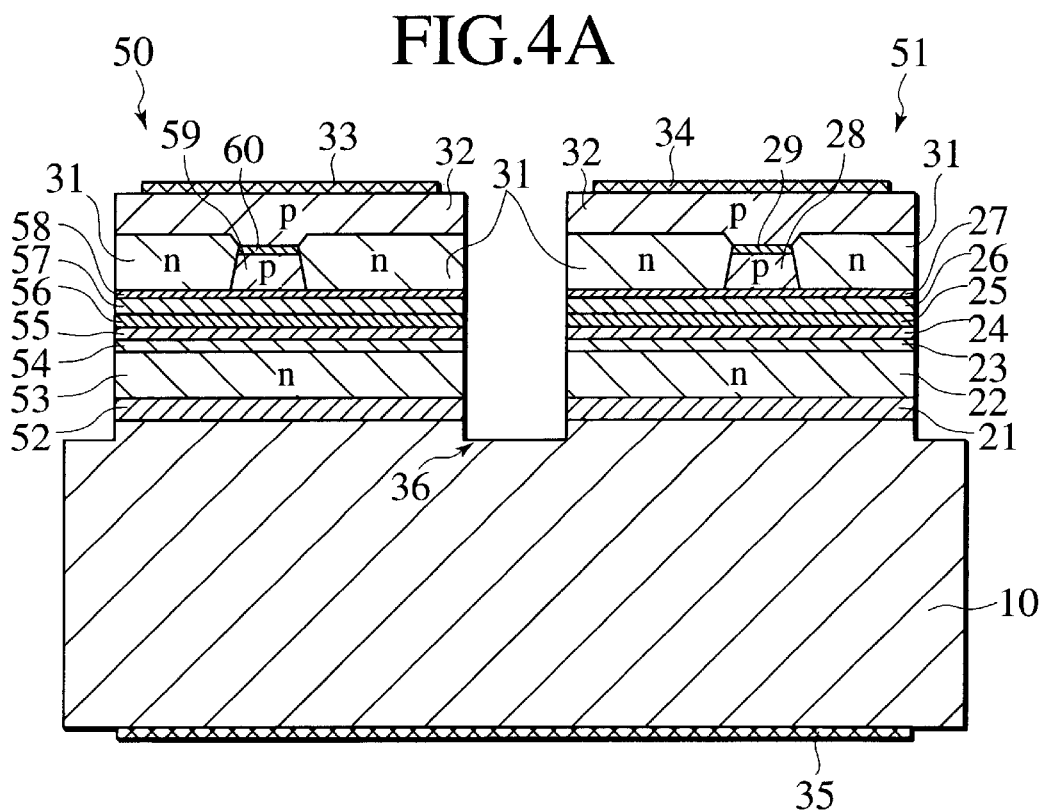
FIG. 4A is a sectional view, vertical to a ridge stripe direction, of a semiconductor laser unit of a second embodiment of the present invention.

FIG. 4A is a sectional view of a double wavelength semiconductor laser unit, having oscillation wavelengths of 780 nm and 650 nm, according to a second embodiment of the present invention. FIG. 4A shows the sectional view vertical to a ridge stripe direction of the double wavelength semiconductor laser unit. A first laser 50 emitting the radiation with the wavelength of 780 nm and a second laser 51 emitting that of 650 nm are merged on a same n-type GaAs semiconductor substrate 10. In the first and second lasers 50, 51, second p-type cladding layers 59, 28 are respectively delineated to form convex stripes, or the ridges, and both the sides of the ridges 59, 28 are sandwiched by GaAs current-blocking layers 31, respectively. This structure channels the current into narrowly limited areas of the active layers 55, 24 then generate the striped gain distributions within the active layers 55, 24 Also, the parts of lights penetrated into first p-type cladding layers 57, 26 among lights transmitted through the active layers 55, 24 at positions below both of the sides of the ridges 59, 28 are absorbed by the GaAs layers 31 whose band gap is narrower than those of the active layers 55, 24. So, selectively optical losses are induced in the active layers 55, 24 at positions below both of the sides of the ridges 59, 28, and the transverse mode becomes single to thereby lead to a quasi-refractive-index-waveguide structure. The transverse single-mode and the current channeling can reduce an aspect ratio of a divergence angle $\theta_\perp$ in the vertical direction to the active layers 55, 24 to a divergence angle $\theta_\parallel$ in a parallel direction to the active layers 55, 24, to a small value such as 4 or less. Also, an operational current, at which the optical power of several mW can be obtained at a room temperature, becomes small such as several ten mA. Moreover, the quasi-refractive-index-waveguide structure can reduce the astigmatism of laser light to a small value such as about 10 $\mu$m. Thus, it is possible to fabricate the semiconductor laser unit suitable for the light sources of the compatible optical pickup system for CD-ROM and DVD-ROM.

In detail, the first laser 50 emitting the radiation with the wavelength of 780 nm is constituted such that an n-type buffer layer 52, an n-type InGaAlP cladding layer 53, a first first band gap discontinuity relaxation layer 54, an AlGaAs bulk active layer 55, a second band gap discontinuity relaxation layer 56, a first p-type InGaAlP cladding layer 57, a p-type InGaP etching stop layer 58, a second p-type InGaAlP cladding layer 59, a p-type InGaP conduction layer 60, an n-type current-blocking layer 31 and a p-type GaAs contact layer 32 are laminated on an n-type GaAs substrate 10 in this order.

The n-type cladding layer 53 is designed such that the composition is $In_{0.5}(Ga_{0.3}Al_{0.7})_{0.5}P$, the layer thickness is about 1 $\mu$m, silicon (Si) is used as dopant, and the carrier concentration is equal to or higher than $1\times10^{17} cm^{-3}$. Also, the first p-type cladding layer 57 and the second p-type cladding layer 59 are designed such that they have the composition of $In_{0.5}(Ga_{0.3}Al_{0.7})_{0.5}P$, the total layer thickness is substantially equal to the thickness of the n-type cladding layer 53, the optical intensity profile along the upper and lower direction of the output laser light is symmetrical with respect to an axis, and the optical axis is parallel to the surface of the active layer. Zinc (Zn) is used as the dopant for the first p-type cladding layer 57 and the second p-type cladding layer 59. The carrier concentration is assumed to be equal to or higher than about $1\times10^{17} cm^{-3}$. Moreover, magnesium (Mg) or carbon (C) may be used as the dopant.

The bulk active layer 55 is characterized in that it is the undoped layer of AlGaAs whose layer thickness is 0.01 $\mu$m or more and 0.1 $\mu$m or less. The bulk active layer 55 of the second embodiment is similar to the first embodiment, but further has the band gap discontinuity relaxation layers 54, 56 made of InGaAlP or InGaP, whose band gap is smaller than that of the cladding layer and larger than that of the bulk active layer 55, are formed on both upper and lower sides of the bulk active layer 55.

Figure 4B:
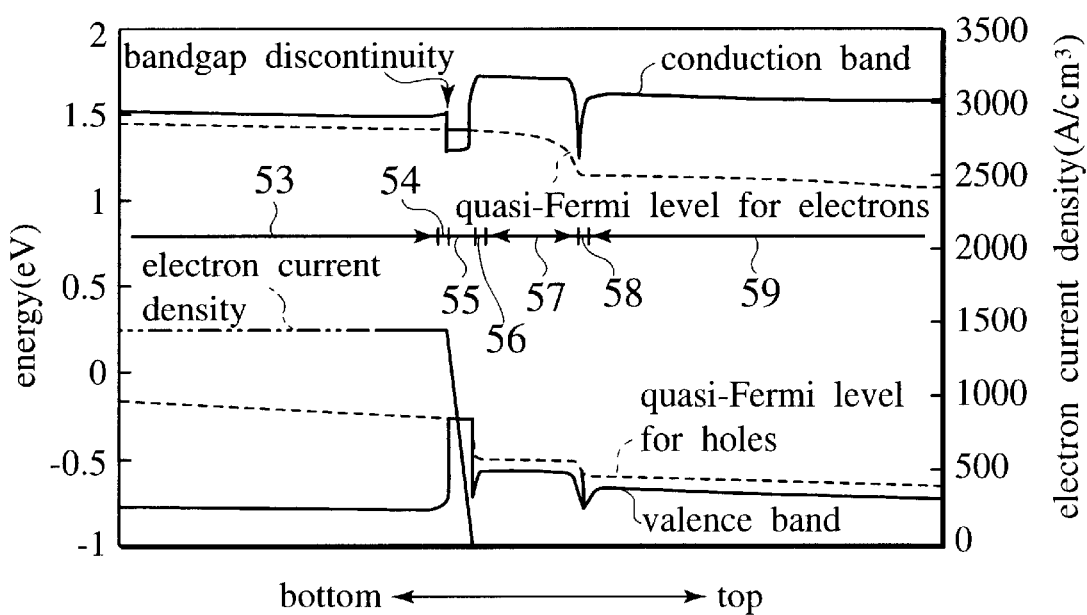
FIG. 4B shows an electron current density distribution and a band diagram, simulated for the first laser of the second embodiment of the present invention.

The improvement of the current injection efficiency due to this structure will be described below with reference to FIG. 4B. In FIG. 4B, the energy band diagram, the Fermi-level diagram and the distribution of the electron current densities, when the forward bias of 2.5 V is applied across the electrodes 50 and 35, are plotted along the lamination direction from the n-type cladding layer 53 to the p-type second cladding layer 59. In FIG. 4B, the compositions, the carrier concentrations and the film thicknesses of the respective semiconductor layers according to the structure of the second embodiment of the present invention are considered to simulate the energy band diagram, the Fermi-level diagram and the distribution of the electron current densities.

The n-type cladding layer is designed such that the Al mole fraction is 0.7 as $In_{0.5}(Ga_{0.3}Al_{0.7})_{0.5}P$, the carrier concentration is $2\times10^{17} cm^{-3}$, and the layer thickness is about 1 $\mu$m. The bulk active layer 55 is designed such that the thickness is 0.44 $\mu$m and it is the undoped layer having the composition of $Al_{0.15}Ga_{0.85}As$. The band gap discontinuity relaxation layers 54, 56 formed on both the upper and lower sides of the bulk active layer 55 are designed such that each of them is the undoped layer having the thickness of 5 nm and the composition of $In_{0.5}(Ga_{0.3}Al_{0.7})_{0.5}P$. There are the two p-type cladding layers 57, 59 sandwiching the etching stop layer 58 between them. However, any of them is designed such that the composition is equal to that of the n-type cladding layer 53, the carrier concentration is $1 \times 10^{18} m^{-3}$, and the total layer thickness is equal to the thickness of the n-type cladding layer 53. A length of a resonator is defined as 600 μm.

The spike height in the first embodiment shown in FIG. 3B was 25% with respect of the potential well depth of the bulk active layer 14. A spike height of the band gap discontinuity induced at the boundary between the AlGaAs bulk active layer 55 and the n-type cladding layer 53 shown in FIG. 4B is 17% with respect to the potential well depth of the bulk active layer 55. So, the height is relatively reduced by about 30% than that of the first embodiment. This improvement enables the density of the electron current injected into the bulk active layer 55 to be 1.6 kA/cm², and it is increased by about 40% as compared with the case of the first embodiment shown in FIG. 3B, which makes the injection efficiency much higher. Thus, it is possible to further reduce the operational current and the operational voltage.

The insertion of the band gap discontinuity relaxation layers 54, 56 increases the optical confinement in the vicinity of the bulk active layer 55. Thus, the divergence angle $\theta_\perp$ in the vertical direction to the bulk active layer 55 is increased in the output laser light. For example, the increase in the divergence angle in the above-mentioned case is about 0.6 degrees, which does not bring about any problem. However, as mentioned above, if the $\theta_\perp$ is too large to thereby make the aspect ratio too high, this is not suitable for the light source for the optical memory disk. Hence, it is desirable that the thicknesses of the band gap discontinuity relaxation layers 54, 56 are 10 nm or less. On the other hand, if this film thickness becomes 1 nm or less, the desired reduction of the band gap discontinuity with the excellent reproducibility cannot be obtained. Hence, it is desirable that the thicknesses of the band gap discontinuity relaxation layers 54, 56 are 1 nm or more and 10 nm or less. The compositions of the band gap discontinuity relaxation layers 54, 56 are different from any of the cladding layers 53, 57 and the bulk active layer 55. There may be a case that some restrictions due to the growth temperature, piping system, gas control system of the MOCVD apparatus, etc. cause the manufacturing process to be difficult. Whether or not the structure of the second embodiment is employable is determined in accordance with the consideration of the extent of the performance improvement and the reproducibility of the fabrication technologies, which will depend on the fabrication apparatus.

The bulk active layer 55 is similar to the first embodiment. That is, if the thickness becomes 0.01 μm (10 nm) or less at which the quantum well effect appears, the large band gap discontinuity is induced at the boundary between the bulk active layer 55 and the first p-type cladding layer 57, similarly to the case of the related art shown in FIG. 2B, and the injection efficiency is reduced. On the contrary, if it becomes thicker than 0.1 μm, optical confinement coefficients Γ in the band gap discontinuity relaxation layers 54, 56 are too large so that they exceed the optical power density, which can be allowed with regard to the reliability of the facets. So, the deterioration on the facet is brought about with regard to the operation for the long time. Hence, it should be reminded that the structure having the bulk active layer 55 thicker than 0.1 may cause a problem in reliability. So, the excellent current injection efficiency can be achieved by setting the thickness of the bulk active layer 55 to be 0.01 μm or more and 0.1 μm or less. Moreover, it is possible to attain the double wavelength semiconductor laser unit having the high reliability.

The oscillation wavelength is also important when it is considered as the semiconductor lasers for the optical memory disk. The Al mole fraction x of the bulk active layer 55, represented as $Al_xGa_{1-x}As$, needs to be 0.1 or more and 0.2 or less, in order to obtain the wavelength of the 780 nm band as the light source for reading the CD-ROM. Moreover, if the thickness of the bulk active layer 55 at this time exceeds 0.05 μm, the divergence angle $\theta_\perp$ in the direction vertical to the bulk active layer 55 exceeds 40 degrees. So, the aspect ratio implying the ratio of the divergence angle $\theta_\perp$ vertical to the bulk active layer 55 to the divergence angle $\theta_\parallel$ parallel to the bulk active layer 55 exceeds 4, which is not suitable for the light source of the optical pickup for reading the optical memory disk such as CD-ROM or the like. Hence, it is desirable that the thickness of the bulk active layer 55 is 0.05 μm or less.

The structure of the second laser 51 will be described below. The second laser 51 emitting the radiation with the wavelength of 650 nm has the structure similar to the first embodiment. An n-type buffer layer 21, an n-type InGaAlP first cladding layer 22, an InGaAlP waveguide layer 23, a MQW active layer 24, an InGaAlP waveguide layer 25, a first p-type InGaAlP cladding layer 26, a p-type InGaP etching stop layer 27, the second p-type InGaAlP cladding layer 28, a p-type InGaP conduction layer 29, n-type current-blocking layers 31 and a p-type GaAs contact layer 32 are laminated on the n-type GaAs substrate 10 in this order.

The MQW active layer 24 is composed of an undoped quantum well layer having a composition of approximate $In_{0.5}Ga_{0.5}P$ and an undoped barrier layer having a composition of $In_{0.5}(Ga_{0.3}Al_{0.5})_{0.5}P$. It is the SCH structure similar to the first embodiment, in which the undoped $In_{0.5}(Ga_{0.3}Al_{0.5})_{0.5}P$ waveguide layers 23, 25 having the same composition as the barrier layer are formed above and below the MQW active layer 24.

The first laser 50 emitting the radiation with the wavelength of 780 nm and the second laser 51 emitting that of 650 nm are designed such that they are electrically isolated from each other by an isolation groove 36 and they can be driven independently of each other by voltages applied between p-side electrodes 33, 34 and an n-side electrode 35, respectively. The n-side electrode 35 is commonly deposited under the substrate 10.

Similarly to the first embodiment, a wafer having the above-mentioned structure can be manufactured by using the MOCVD technique, the photolithography technique and the etching technique, which are disclosed in Uchizaki et al. By the way, the RIE is used for forming the isolation groove in Uchizaki et al., the typical wet chemical etching technique may be used if the width of the isolation groove 36 is relatively wide, such as several ten μm or more.

The wafer in which the first laser 50 emitting the radiation with the wavelength of 780 nm and the second laser 51 emitting that of 650 nm are formed is cleaved out as a bar-shaped semiconductor chip with a width corresponding to the necessary resonator length. Then, the collective coating of the reflection mirrors is done on the facets of the bar-shaped semiconductor chip. The method similar to that explained in the first embodiment can be applied with regard to the reflection mirror on the facets of the bar-shaped semiconductor chip. That is, the reflection mirror on the front facet side from which the laser light is emitted to the external portion is deposited such that the optical film thickness of the reflection mirror is $\lambda/2$, or integer times thereof with respect to the wavelength λ=715 nm. The wavelength λ is substantially middle between the wavelengths of 650 nm and 780 nm. The $Al_2O_3$ film can be used as the material of the reflection mirror. Thus, the mirror reflectivity of the reflection mirror is about 30%. The reflection mirror on the rear facet is designed such that the mirror reflectivity at the wavelength λ=715 nm, is 63% or more.

The structure of the reflection mirror can be attained as: the multiple-layer structure in which the $Al_2O_3$ film as the low refractive index film and the Si film as the high refractive index film are paired; or the multiple-layer structure in which the $Al_2O_3$ low refractive index film in contact with the facet, the $SiO_2$ low refractive index film repeatedly laminated thereon and the SiN high refractive index film are paired; or the multiple-layer structure in which the $TiO_2$ high refractive index film and the $Al_2O_3$ low refractive index film are paired. Also, in such a way that the optical film thicknesses of the respective reflection mirrors are λ/4 or odd-numbered times thereof with respect to λ=715 nm. The film thickness is set for at least one layer or more of the optical thickness. Accordingly, it is possible to carry out the reflection mirror deposition on the cleaved facet having the excellent reproducibility. Due to those reflection mirrors on the facet of the bar-shaped semiconductor chip, it is possible to manufacture the double wavelength semiconductor laser unit with the excellent reproducibility, which can obtain the optical powers of 5 mW or more in the respective wavelengths of 650 nm and 780 nm at the case temperature of 70° C. or more.

Third Embodiment

Figure 5A:
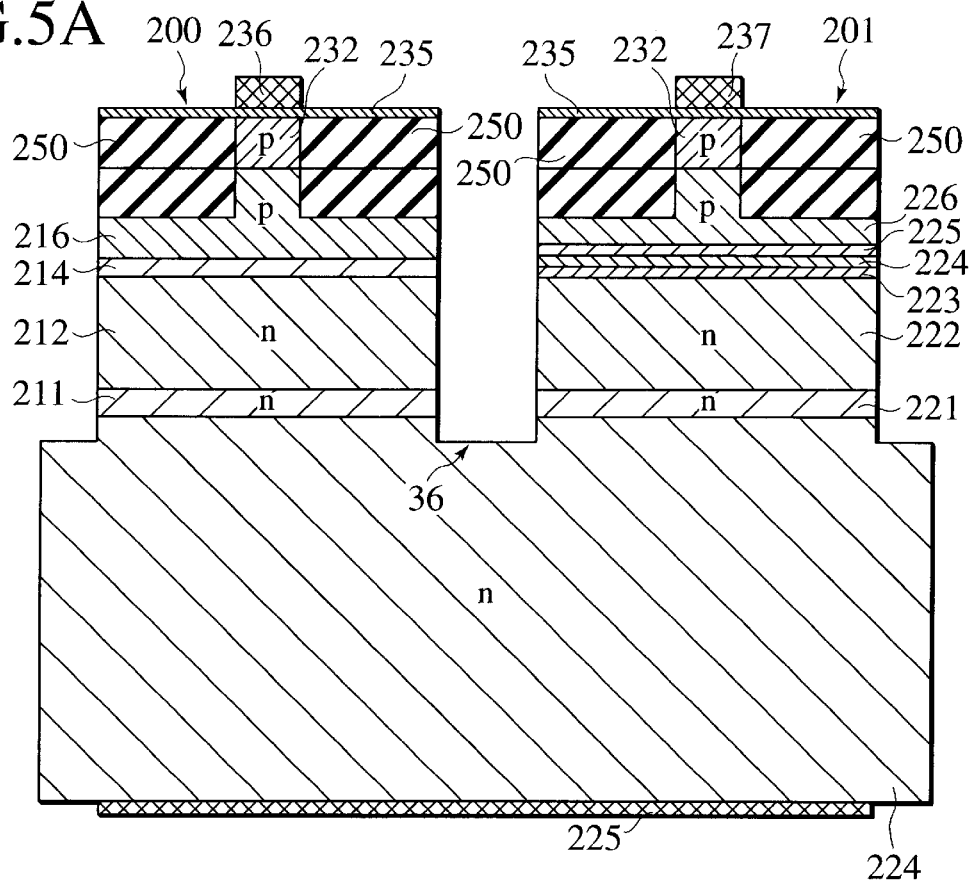
FIG. 5A is a sectional view of a semiconductor laser unit according to a third embodiment of the present invention.
Figure 5B:
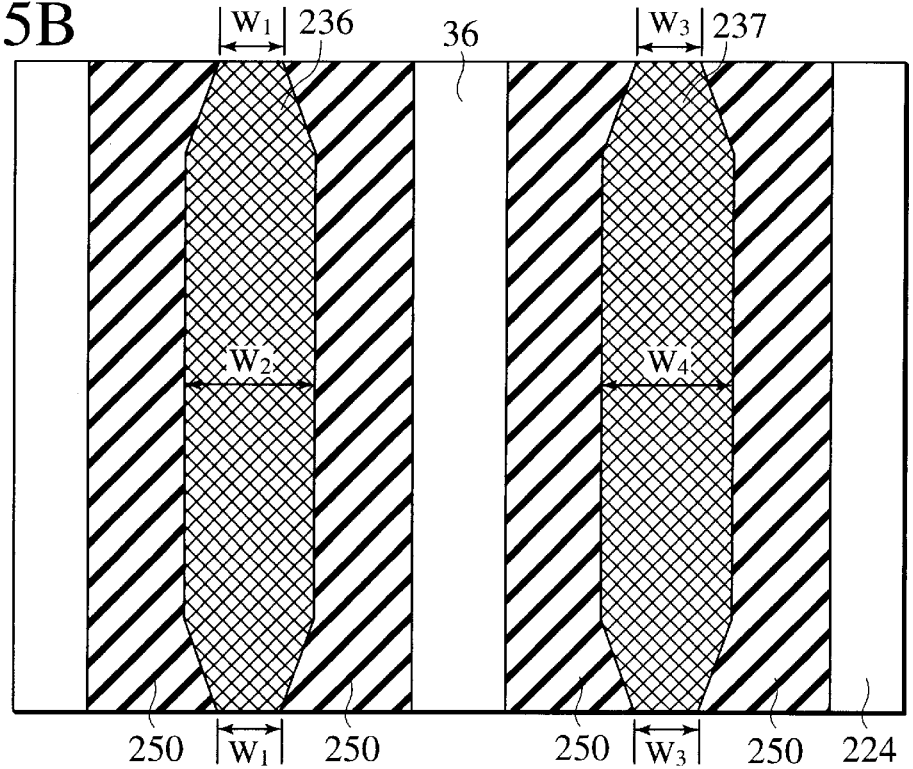
FIG. 5B is a top view showing the semiconductor laser unit according to a third embodiment of the present invention.

FIGS. 5A and 5B show a third embodiment of the present invention, which has a gain waveguide type structure referred to as "a tapered stripe (TAPS) structure". A first laser 200 emitting the radiation with the wavelength of 780 nm and a second laser 201 emitting that of 650 nm are merged on an n-GaAs crystal substrate 224. N-type buffer layers 211, 221 are formed on the crystal substrate 224, correspondingly to the first and second lasers 200, 201. An n-type InGaAlP cladding layer (first laser cladding layer of first conductivity type) 212 is formed on the n-type buffer layers 211. And an n-type InGaAlP cladding layer (second laser cladding layer of first conductivity type) 222 having the compositions equal to the n-type InGaAlP cladding layer 212 is formed on the n-type buffer layer 221. An AlGaAs bulk active layer 214 having thicknesses of 0.01 to 0.1 μm are formed on the n-type InGaAlP cladding layer 212. An MQW active layer 224 sandwiched by waveguide layers 223, 225, is formed on the n-type InGaAlP cladding layer 222. Further, p-type InGaAlP cladding layer (first laser cladding layer of second conductivity type) 216 is formed on the AlGaAs bulk active layer 21. And p-type InGaAlP cladding layer (second laser cladding layer of second conductivity type) 226 made of constituent elements common to the p-type InGaAlP cladding layer 216 is formed on MQW active layer 224. Further, a p-type GaAs contact layers 232 are formed on the p-type InGaAlP cladding layers 216 and 226.

Due to such structure, it is possible to attain a semiconductor laser for outputting a laser light having many wavelengths, in which an operational voltage and an operational current are low, similarly to the first embodiment. Moreover, the excellent current injection efficiency can be achieved by setting the thickness of the active layer in the laser emitting the radiation with the wavelength of 780 nm to 0.01 to 0.1 μm. Also, it is possible to attain a double wavelength semiconductor laser unit having a high reliability.

In the structure of the third embodiment, the Al mole fraction x of the active layer represented as $Al_xGa_{1-x}As$ needs to be 0.1 or more and 0.2 or less, in order to obtain the wavelength of the 780 nm band as the light source for reading the CD-ROM. Moreover, if the thickness of the active layer at this time exceeds 0.05 μm, the aspect ratio $(\theta_\perp/\theta_\parallel)$ is 4 or more. Thus, it is further desirable that the thickness of the active layer is 0.05 μm or less. More preferably, the thickness of the active layer should be in the range between 0.01 μm and 0.05 μm.

The n-type cladding layers 212, 222 are constituted by common element for both to the first laser 200 and the second laser 201, and the p-type cladding layers 216, 226 are constituted by common element for both to the first laser 200 and the second laser 201. Thus, if the laminated structure is grown by the MOCVD method, it is possible to use the common growth conditions with regard to source gas compositions, flow rate, and growth temperatures etc. Then, this provides the structure which has the extremely high reproducibility and is suitable for mass production, as compared with the case that the cladding layers constituted by the respectively different elements, for example, the cladding layer of the laser emitting the radiation with the wavelength of 780 nm is constituted by the AlGaAs layer and the cladding layer of the device emitting the radiation with the wavelength of 680 nm is constituted by InGaAlP. The n-side electrode 225 is formed on a bottom surface of the crystal substrate 224.

Also, a p-side ohmic electrode 235 is formed on the p-type contact layer 232. Moreover, a striped metal pattern (a first laser metal pattern) 236 is delineated on the p-side ohmic electrode 235 of the first laser 200. And, another striped metal pattern (a second laser metal pattern) 237 is delineated on the p-side ohmic electrode 235 of the second laser 201. These metal patterns 236, 237 are taper-shaped in which widths w1, w3 at the ends of the semiconductor chip are narrower than the central stripe widths w2, w4, positioned in centers of the semiconductor chip, as shown in FIG. 5B. These metal patterns are used as masks to then carry out the ion implantation of protons ($H^+$). So, outer portion of the stripe becomes semi-insulating semiconductor regions 250 up to the portions immediately above the active layers 214, 224. Thus, current-blocking regions (first and second laser current-blocking layers) 250 made of the semi-insulating semiconductor regions are formed. Due to this current-blocking region 250, when a voltage is applied across the electrodes, the spacing between the current flow lines due to the injected carriers is wider at the central portion than that in the vicinity of the facet. The curvature on a phase front of lights, which is the phenomenon peculiar to the gain waveguide laser, can be slightly relaxed by the fact that the width of the gain medium is wider in the center of the semiconductor chip. Hence, it is possible to obtain a transverse mode profile having a single crest. Moreover, the narrower width of the stripe in the vicinity of the facet enables the $\theta_\parallel$ to be wider, and also the structure of the third embodiment enables the aspect ratio to be improved over the typical gain waveguide laser.

Figure 6:
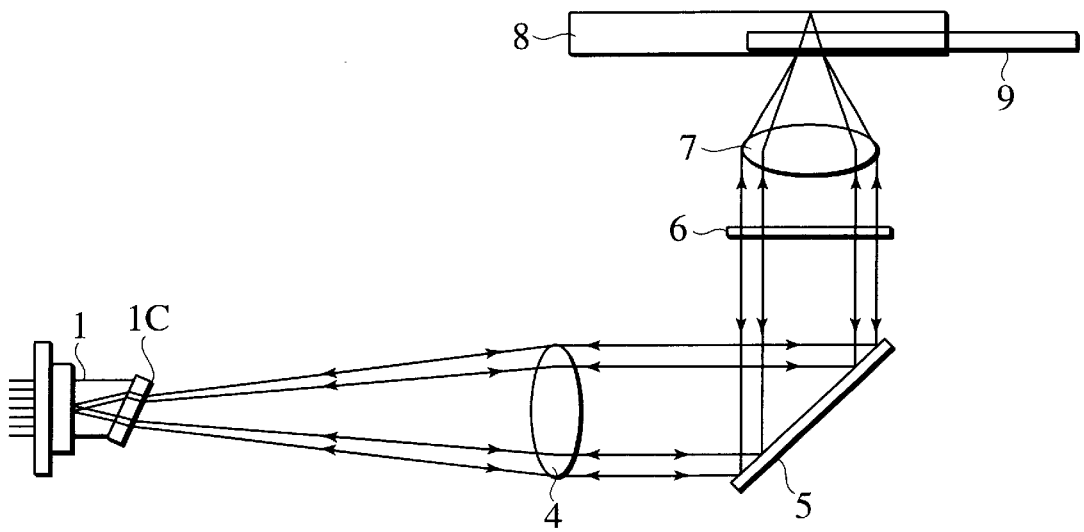
FIG. 6 shows a configuration of the optical system when the semiconductor laser unit according to the third embodiment of the present invention is applied to an optical pickup of a DVD system.

Such TAPS structure provides a longitudinally multiple mode oscillation. Thus, a certain level of noise level can be maintained even if there is the return light from the optical memory disk, without employing high frequency modulation to the oscillation frequency. This noise level is inferior to that of the case when the high frequency modulation is applied in the SBR structure laser. However, this does not provide the serious disadvantage in an optical memory disk for a special application field in which a standard of noise performance is not so severe as that of the typical DVD-ROM system. Also, the astigmatism is 20 to 30 μm, which is inferior to that of the laser having the SBR structure. However, as shown in FIG. 6, this can be solved to a degree by making a glass cap 1C of an optical integration unit 1 slant. Although the TAPS structure has several disadvantages as mentioned above, the structure is simple, and it can be manufactured at a relatively low cost. Hence, it can be said that this is the structure suitable for the double wavelength semiconductor laser unit in which the low manufacturing cost is required as the highest priority.

Fourth Embodiment

Figure 7:
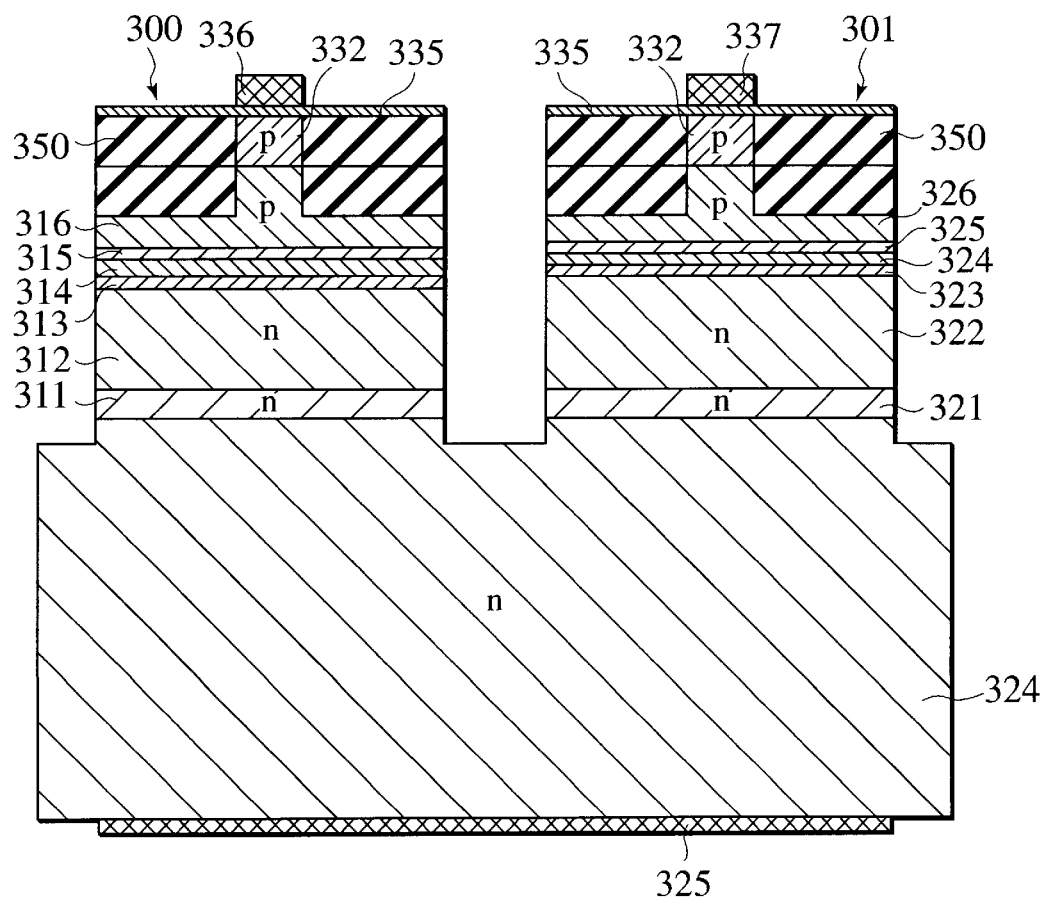
FIG. 7 is a sectional view showing a semiconductor laser unit according to a fourth embodiment of the present invention

FIG. 7 is a sectional view showing a semiconductor laser according to a fourth embodiment of the present invention. The semiconductor laser in the fourth embodiment has the structure substantially equal to that of the third embodiment shown in FIG. 5A.

A first laser 300 emitting the radiation with the wavelength of 780 nm and a second laser 301 emitting that of 650 nm are merged on an n-GaAs crystal substrate 324. N-type buffer layers 311, 321 are formed on the crystal substrate 324, correspondingly to the first and second lasers 300, 301. N-type InGaAlP cladding layers 312, 322 having the compositions equal to each other are formed on them. An AlGaAs bulk active layer 314 having thicknesses of 0.01 to 0.1 μm is formed on the n-type InGaAlP cladding layer 312. And an MQW active layer 324 sandwiched between waveguide layers 323, 325 is formed on the n-type InGaAlP cladding layer 322. P-type InGaAlP cladding layers 316, 326 made of constituent elements common to the first laser 300 and the second laser 301 is formed on the AlGaAs bulk active layer 314 and the MQW active layer 324. And a p-type GaAs contact layer 332 are formed on those layers.

The fourth embodiment has the structure in which a lower operational voltage can be obtained since a first band gap discontinuity relaxation layer 313 of InGaAlP is further inserted into lower side of the active layer 314 in the first laser 300 emitting the radiation with the wavelength of 780 nm, and a second band gap discontinuity relaxation layer 315 of InGaAlP is further inserted into upper side of the active layer 314. The other structure is common to that of the third embodiment. Thus, the duplicate explanation is omitted.

Various modifications will become possible for those skilled in the art after receiving the teachings of the present disclosure without departing from the scope thereof. For example, the claimed first conductivity type may be p-type, and the second conductivity type opposite to the first conductivity type may be n-type, although the first conductivity type was assumed to be n-type, and the second conductivity type to be p-type in the above explanation of the embodiment.

What is claimed is:
1. A semiconductor laser unit comprising:
    a substrate;
    a first laser emitting a light of a first wavelength, disposed on said substrate, having:
        a bulk active layer having a thickness larger than the quantum-mechanical-maximum thickness, configured such that electrons in the bulk active layer can be treated by classical theories, but not larger than 0.1 μm, the quantum-mechanical-maximum thickness being so defined that only under the maximum thickness the electrons are allowed to be treated by quantum-mechanical analysis;
        a first cladding layer of a first conductivity type, directly contacting a lower portion of said bulk active layer;
        a first cladding layer of a second conductivity type opposite to the first conductivity type directly contacting an upper portion of said bulk active layer; and
    a second laser disposed on said substrate and isolated from said first laser, having a multi quantum well active layer in which the electrons are treated by the quantum-mechanical analysis, comprising a plurality of potential well structure composed of a quantum well layer and barrier layer adjacent to the quantum well layer, the second laser emitting a light of a second wavelength different from said first wavelength.

2. The semiconductor laser unit of claim 1, wherein said first laser further comprises:
    a second cladding layer of the second conductivity type, disposed, in the form of a stripe having a width narrower than said first cladding layer of the second conductivity type, on said first cladding layer of the second conductivity type running along a longitudinal direction; and
    first laser current-blocking layers disposed above said first cladding layer of the second conductivity type so as to sandwich said second cladding layer.

3. The semiconductor laser unit of claim 2, wherein said second laser further comprises:
    a second laser cladding layer of the first conductivity type, disposed under a lower portion of said multi quantum well active layer;
    a second laser cladding layer of the second conductivity type, disposed in the form of a stripe along a longitudinal direction, above an upper portion of said multi quantum well active layer; and
    second laser current-blocking layers disposed above said multi quantum well active layer so as to sandwich said second laser cladding layer of the second conductivity type.

4. The semiconductor laser unit of claim 3, wherein said first and second laser current-blocking layers are semiconductor regions of the first conductivity type.

5. The semiconductor laser unit of claim 3, wherein said first and second laser current-blocking layers are semi-insulating semiconductor regions.

6. The semiconductor laser unit of claim 3, wherein constituent elements of said first cladding layer of the second conductivity type are the same as the constituent elements of said second laser cladding layer of the second conductivity type.

7. The semiconductor laser unit of claim 6, wherein said first cladding layer of the second conductivity type is made of $In_y(Ga_{1-x}Al_x)_{1-y}P$ ($0<x\leq1$, $0\leq y\leq1$).

8. The semiconductor laser unit of claim 7, wherein said first cladding layer of the second conductivity type is made of $In_y(Ga_{1-x}Al_x)_{1-y}P$ ($0<x\leq0.7$, $0\leq y\leq1$).

9. The semiconductor laser unit of claim 3, wherein constituent elements of said first laser current-blocking layer are same as the constituent elements of said second laser current-blocking layer.

10. The semiconductor laser unit of claim 3, wherein said first and second laser current-blocking layers are made of GaAs.

11. The semiconductor laser unit of claim 2, wherein said first laser further comprises a metal pattern in the form of the stripe, selectively disposed above upper portions of said second cladding layer of the second conductivity.

12. The semiconductor laser unit of claim 11, wherein said metal pattern has a taper-shaped pattern in which widths at both ends are narrower than the width at a central portion.

13. The semiconductor laser unit of claim 1, wherein said bulk active layer is made of $Al_zGa_{1-z}As$ ($0.1 \leq z \leq 1$).

14. The semiconductor laser unit of claim 13, wherein said bulk active layer is made of $Al_zGa_{1-z}As$ ($0.1 \leq z \leq 0.2$).

15. The semiconductor laser unit of claim 1, wherein said multi quantum well active layer is composed of the quantum well layer of InGaP and the barrier layer of $In_{0.5}(Ga_{1-q}Al_q)_{0.5}P$ ($0<q<1$) adjacent to the quantum well layer.

16. The semiconductor laser unit of claim 1, further comprising a reflection mirror deposited on facets of said first laser and said second laser, the reflection mirror includes at least one layer of a film having thicknesses equal to $\lambda/4$, odd-numbered times of $\lambda/4$, $\lambda/2$ or integer times of $\lambda/2$, with respect to a middle wavelength $\lambda$ between said first and second wavelengths.

17. A semiconductor laser unit comprising:

a substrate;

a first laser emitting a light of a first wavelength, disposed on said substrate, having:

a bulk active layer having thickness larger than the quantum-mechanical-maximum thickness, configured such that electrons in the bulk active layer can be treated by classical theories, but not larger than 0.1 $\mu$m, the quantum-mechanical-maximum thickness being so defined that only under the maximum thickness the electrons are allowed to be treated by quantum-mechanical analysis;

a first band gap discontinuity relaxation layer directly disposed under said bulk active layer, constituted by a compound semiconductor in which a band gap is larger than said bulk active layer;

a first cladding layer of a first conductivity type having a band gap larger than said first band gap discontinuity relaxation layer, directly contacting a lower portion of said first band gap discontinuity relaxation layer;

a second band gap discontinuity relaxation layer directly disposed on said bulk active layer, constituted by a compound semiconductor in which a band gap is larger than said bulk active layer;

a first cladding layer of a second conductivity type opposite to the first conductivity type, having a band gap larger than said second band gap discontinuity relaxation layer, directly contacting an upper portion of said second band gap discontinuity relaxation layer; and a second laser disposed on said substrate and isolated from said first laser, having a multi quantum well active layer in which the electrons are treated by the quantum-mechanical analysis, comprising a plurality of potential well structure composed of a quantum well layer and barrier layer adjacent to the quantum well layer, the second laser emitting a light of a second wavelength different from said first wavelength.

* * * * *

UNITED STATES PATENT AND TRADEMARK OFFICE
CERTIFICATE OF CORRECTION

PATENT NO.     : 6,618,420 B1
DATED          : September 9, 2003
INVENTOR(S)    : Koichi Gen-Ei et al.

It is certified that error appears in the above-identified patent and that said Letters Patent is hereby corrected as shown below:

<u>Title page,</u>
Item [*] Notice, "0 days" should be -- 162 days --.

Signed and Sealed this

Thirtieth Day of December, 2003

JAMES E. ROGAN
*Director of the United States Patent and Trademark Office*